United States Patent [19]

Hart et al.

[11] Patent Number: 4,888,603

[45] Date of Patent: Dec. 19, 1989

[54] LIGHT EMITTING DIODE ARRAY

[75] Inventors: Peter B. Hart, Northampton; George A. A. Chilton, Buckinghamshire; Richard A. Kirk, Northants, all of England

[73] Assignee: The Plessey Company plc, Ilford, England

[21] Appl. No.: 251,524

[22] Filed: Sep. 30, 1988

[30] Foreign Application Priority Data

Sep. 30, 1987 [GB] United Kingdom ............... 8722946

[51] Int. Cl.[4] ........................................... G01D 15/00
[52] U.S. Cl. .................................... 346/160; 346/155
[58] Field of Search .......... 346/160, 155, 154, 139 R, 346/134 C; 400/119

[56] References Cited

U.S. PATENT DOCUMENTS 4,763,142 8/1988 Saitoh et al. ........................ 346/160
4,797,694 1/1989 Agostinelli et al. ................ 346/160

Primary Examiner—Arthur G. Evans
Attorney, Agent, or Firm—Fleit, Jacobson, Cohn, Price, Holman & Stern

[57] ABSTRACT

In order to reduce thermal coupling between diodes in a light emitting diode array for a printing or imaging system which has the undesirable effect of wavelength shift and output reductions, rows (12, 14) of diodes are provided which are separated and inclined to the direction (Y) of scanning movement during a print operation, wherein current pulses applied to the diodes of each row for energization are delayed with respect to one another such that energization and printing occurs in a line perpendicular to the direction of scanning movement.

5 Claims, 2 Drawing Sheets

LIGHT EMITTING DIODE ARRAY

This invention relates to an array of light-emitting diodes (LED) fabricated on a single integrated circuit chip as a monolithic array, forming a print head for use in printing and imaging systems.

Such LED arrays are used in printing and imaging systems, together with a suitable imaging lens or lens array, to make an image on an appropriate sensor material, such as a photographic film or a photo-sensitive drum as used in a xerographic copier. Currently, images are required with pixel densities of at least 240 dots per inch and, for higher definition systems, 500–600 dpi may be needed. In addition, systems which use half-tone techniques to provide grey scale variations in intensity or colour require even finer resolutions of 2000–3000 dpi.

Integrated circuits carrying such LED arrays can be made by standard diffusion, photo-engraving and metallurgic etching techniques. Emission wavelengths can typically be provided in the range 650–850 nm by using GaAsP material grown on gallium arsenide substrates. Such an LED array needs to operate at very high brightness since it is used together with an optical system to achieve high energy densities at the image plane. Diode sizes in such arrays can range from 50 μm diameter or more down to 10 μm or less and with peak currents ranging from 1 mA to 100 mA or more. At current densities of up to 10000 A/cm² or above, significant heating effects can take place within the LED elements causing shifts in wavelength and also some fall-off in optical power. These effects cause problems where sensor response, and hence print quality, is severely affected by changes in parameter values, thus for the systems referred to above, control to within ±5 nm of emission wavelength and ±1% of optical output can be required. In addition to heating effects within the diode element itself, which are related to current pulse lengths and magnitude, individual diode elements can also be affected by heat generation from neighbouring diode elements. For example, in the known type of diode array shown in FIG. 1, diodes 2 with 25 μm sides were fabricated in two rows on a chip substrate 4, with spacings as shown of 25 μm. A diode in the centre of the array has four nearest neighbours, two at 50 μm and two at approximately 55 μm centre to centre distance. Four next nearest neighbours are at 80 μm and 100 μm and four further at 135 μm and 150 μm. The temperature rise of such a diode can be measured for a drive current of, say, 10 mA and then subsequent temperature rises, measured as other diodes in the array are switched on. With the array mounted on a well heat sunk package, typical temperature rises (monitored by measuring frequency change of the LED) and wavelength shifts are given in Table 1.

TABLE 1

|  | Temperature | Wavelength |
|---|---|---|
| Centre diode alone, 10 mA | 14° C. | 4.2 nm |
| 4 nearest neighbour diodes at 10 mA each | 14.4° C. | 4.3 nm |
| 4 next nearest neighbour diodes at 10 mA each. | 4.8° C. | 1.4 nm |
| 4 next nearest neighbour diodes at 10 mA each. | 2.4° C. | 0.7 nm |
| Total | 35.6 | 10.6 |

In addition to these wavelength shifts toward the red end of the spectrum, LED power output also drops by ca. 0.7% per °C.

The problem to which the present invention is directed is the reduction of heating effects between adjacent diodes of a diode array whilst ensuring that there is no reduction of print quality.

The present invention provides a light emitting diode array for a printer head fabricated on a single integrated circuit chip and comprising at least two parallel rows of diodes, each row comprising a plurality of diodes, wherein the diodes have a predetermined width, and the spacing between adjacent diodes in a row is substantially more than the predetermined width for reducing thermal coupling and the spacing between adjacent rows is substantially more than the predetermined width for reducing thermal coupling, wherein the rows are inclined to the intended direction of relative movement between the paper and printer head during a print operation, means for applying electric current pulses to the diodes, and means for delaying application of the current pulses such that during a print operation the diodes are powered by current pulses at instants when the diodes occupy the same print position in the direction of relative movement, for producing a print line perpendicular to the direction of relative movement. Thus in accordance with the invention, the diodes of this array may be spaced as far apart as necessary, in order to reduce thermal coupling between diodes. However, by introduction of suitable time delays in the application of current pulses, the diodes are powered at instants when the diodes occupy the same print position in the relative direction of movement over the print surface, for producing a line of print perpendicular to the scan direction.

Although, depending on the spacing of the diodes, relatively large delays may have to be introduced, these delays may have no overall delaying effect on the print process, since the diodes in a single row may be energised in order to print simultaneously in different lines perpendicular to the relative direction.

A preferred embodiment of the invention will now be described with reference to the accompanying drawings wherein.

Figure 2:
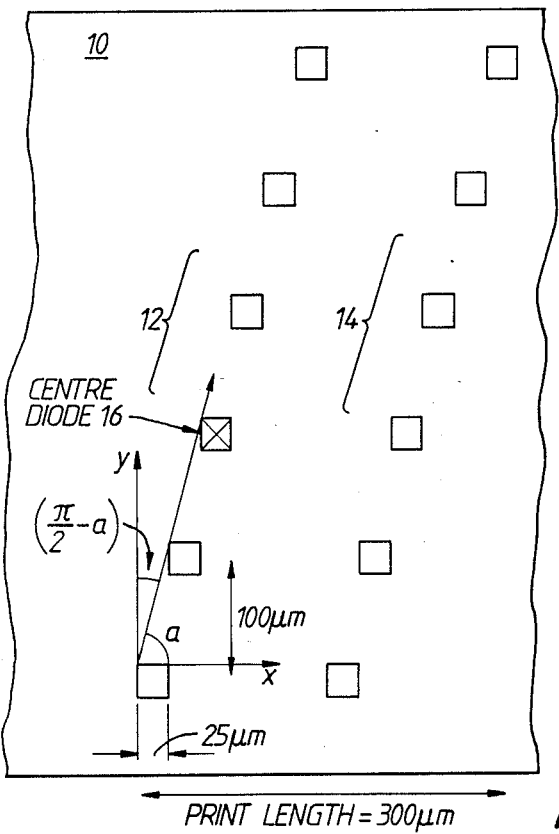
FIG. 2 is a diagram of a monolithic LED array according to a preferred embodiment of the invention.

Referring now to FIG. 2, an integrated circuit substrate 10 carries two rows of diodes 12, 14 which are disposed at an angle ($\pi/2$-a) to the direction of relative movement Y of the print surface relative to the print head carrying the substrate. Each row comprises diodes 16, each diode 16 being 25 μm square and spaced from adjacent diodes in the Y direction by a distance of 100 μm. The centre of each diode is displaced from the centres of adjacent diodes in a row in the X direction, in which a print line may be formed by a distance of 25 μm. Adjacent rows are spaced by a distance of 125 μ in the X-direction, so that the centre of the lower most diode of row 4 is displaced from the centre of the uppermost diode of row 2 by a distance of 25 μm in the X direction.

Figure 1:
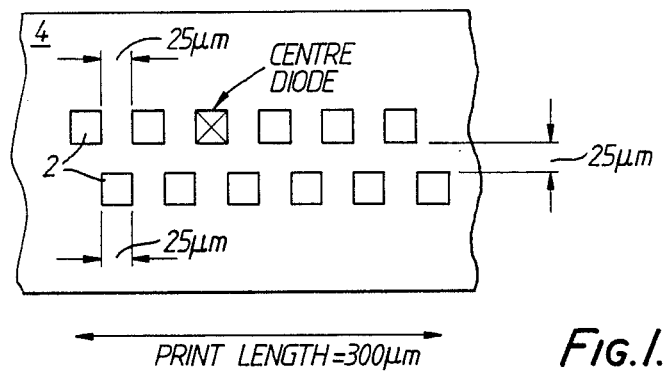
FIG. 1 is a diagram of a known LED monolithic array for use in a line printer.

The contribution of the surrounding diodes to the temperature of the centre diode 16 was measured when all diodes were operating at 10 mA drive current:

|  | FIG. 1 array | FIG. 2 array |
|---|---|---|
| Temperature of centre diode all diodes on. | 35° C. | 22° C. |
| Temperature of centre diode centre diode on alone. | 14° C. | 14° C. |
| Contribution to temperature of centre diode from other diodes. | 21° C. | 8° C. |

The thermal contribution of surrounding diodes was reduced from 21° C. to 8° C. by changing from FIG. 1 to FIG. 2 (a reduction of 62%).

In this example, the angle a is chosen as $\tan^{-1} 4$ so that when adjacent diodes occupy the same position in the Y direction during scanning, they occupy adjacent positions at the printing position in the X direction. Scanning speed and system clock frequency are chosen such that an integral number of clock pulses elapse before an adjacent diode occupies the same position in the Y direction. It will be understood that the angle a may be varied depending on the spacing of the diodes and other factors and a convenient angle is $\tan^{-1} n$ (where n=1, 2, 3, 4 or 5).

Furthermore in some applications adjacent diodes in a row may be spaced by variable amounts (appropriate electronic delays being provided) so that it is not possible to define an angle of inclination to the scanning direction.

Figure 3:
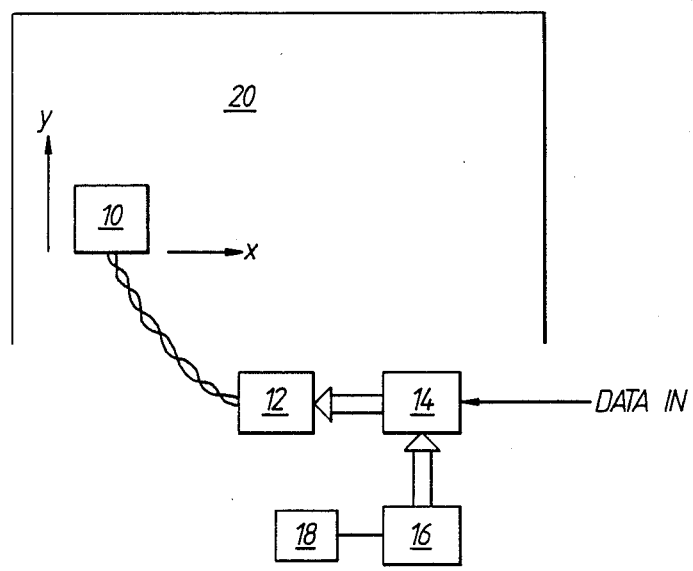
FIG. 3 is a block circuit diagram of a print system incorporating the array of FIG. 2; and, FIG. 4 is a schematic view of the LED array for explanation of current pulse delay.

Referring to FIG. 3, a print head control system is shown wherein a print head 10 comprising an integrated circuit chip as shown in FIG. 2 is powered by a current pulse driver 12, the application of pulses being controlled by information in a print store (RAM) 14. A microprocessor control 16 is provided for control of the system, and a system clock 18 is provided. These elements are provided on a board to be fitted in a conventional printing system. Head 10 is arranged to print on a paper surface 20 which moves relative to the head 10 in the Y direction indicated.

Print data is entered into store 14 from a printing system and is modified in store 14 by storing and reaccessing it in memory in a particular order, to produce the delays required to form a correct image from a staggered array. This reordering is achieved by microprocessor control 16 operating on memory 14.

Incoming data consists of a data word for each LED in the bar. This information is presented line by line for each line of print.

Figure 4:
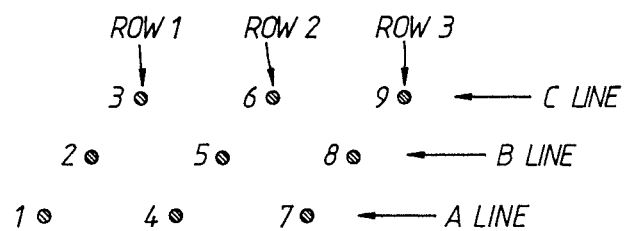

Thus if the array is as shown in FIG. 4, three rows, the first row comprising diodes 1, 2, 3, the second row diodes 4, 5, 6 and the third row 7, 8, 9 providing three staggered lines, then memory space for three lines of data is required, say initially lines A, B, C. The data word for LED 1 in line A is denoted 1A, for LED 2, 2A etc.

Data is read into memory in the sequence.

|  | 1A | 2A | 3A | 4A | 5A | 6A | 7A | 8A | 9A | ... NA |
|---|---|---|---|---|---|---|---|---|---|---|
| then | 1B | 2B | 3B | 4B... | | | | | | |

But when lines A, B, C are in memory the data is read out and presented to the driver in the sequence, (NB 0 indicates no data).

| 1. | 1A | 20 | 30 | 4A | 50 | 60 | 7A | 80 | 90 | ... etc |
|---|---|---|---|---|---|---|---|---|---|---|
| 2. | 1B | 2A | 30 | 4B | 5A | 60 | 7B | 8A | 90 | ... etc |
| 3. | 1C | 2B | 3A | 4C | 5B | 6A | 7C | 8B | 9A | ... etc |

Then line D is fed in to the memory space vacated by line A data, and then read out in the sequence.

| 4. 1D 2C 3B 4D 5C 6B 7D 8C 9B ... |
|---|

Then line E is fed in to the memory space vacated by line B data, and read out in the sequence.

| 5. 1E 2D 3C 4E 5D 6C 7E 8D 9C ... |
|---| and so on.

We claim:

1. A light emitting diode array for printing or imaging, formed on a single integrated circuit chip and comprising at least two parallel rows of diodes, each row comprising a plurality of diodes, wherein the diodes have a predetermined width, and the spacing between adjacent diodes in a row is substantially more than the predetermined width for reducing thermal coupling and the spacing between adjacent rows is substantially more than the predetermined width for reducing thermal coupling, wherein the rows are inclined to the intended direction of relative movement between the paper and printer head during a print operation, means for applying electric current pulses to the diodes, and means for delaying application of the current pulses such that during a print operation the diodes are powered by current pulses at instants when the diodes occupy the same print position in the direction of relative movement, for producing a print line perpendicular to the direction of relative movement.

2. An array as claimed in claim 1 wherein the diode spacing is chosen in relation to the speed of movement and clock frequency of the print system that the current pulses are delayed by an integral number of clock pulses.

3. An array as claimed in claim 1 wherein at least two diode rows are provided, and the uppermost diode in one row is positioned adjacent to the lowermost diode in the next row in the direction perpendicular to relative movement.

4. An array as claimed in claim 1 wherein adjacent diodes in any row are positioned adjacent to one another in the direction perpendicular to relative movement.

5. An array as claimed in claim 1 wherein adjacent diodes in any row are spaced from one another in the direction of relative movement by a distance equal to an integral number of lengths of a single diode.

* * * * *